United States Patent [19]

Itakura

[11] Patent Number: 4,695,978
[45] Date of Patent: Sep. 22, 1987

[54] SEMICONDUCTOR MEMORY DEVICE

[75] Inventor: Tohru Itakura, Kuwana, Japan

[73] Assignee: Fujitsu Limited, Kawasaki, Japan

[21] Appl. No.: 798,186

[22] Filed: Nov. 14, 1985

[30] Foreign Application Priority Data

Nov. 15, 1984 [JP] Japan .................. 59-241205

[51] Int. Cl.$^4$ .............................................. G11C 5/02
[52] U.S. Cl. ...................................... 365/51; 365/230
[58] Field of Search ................. 365/51, 63, 72, 189, 365/230

[56] References Cited

U.S. PATENT DOCUMENTS 4,463,448  7/1984  Sugo et al. ......................... 365/190
4,546,457  10/1985  Nozaki et al. ...................... 365/230

Primary Examiner—Joseph A. Popek
Attorney, Agent, or Firm—Staas & Halsey

[57] ABSTRACT

A semiconductor memory device including at least one pair of memory cell arrays having a plurality of word lines, a plurality of bit lines, and a plurality of memory cells disposed at intersections of the word lines and the bit lines. A plurality of word line driving transistors are connected to the word lines and aligned at inner edges of the pair of memory cell arrays. The pitch of a pair of word line driving gate circuits is matched to the pitch of the two adjacent word line, and at least a pair of word lines driving gate circuits are arranged along the direction of the word lines between the pair of memory cell arrays. The outputs of the word line driving gate circuits are connected to the word line driving transistors. A plurality of decoder lines extend between the pair of word line driving gate circuits and are connected to the input terminals of the word line driving gate circuits.

5 Claims, 5 Drawing Figures

SEMICONDUCTOR MEMORY DEVICE

BACKGROUND OF THE INVENTION

1. Field of the Invention

The present invention relates to a pattern layout of a semiconductor memory device. More particularly, the present invention relates to a pattern layout of word line driving gate circuits.

2. Description of the Related Art

Large computers and supercomputers offer increasingly sophisticated computation functions. Along with the increase in functions computers have become increasingly large in size. This has led to demands for miniaturization of computers.

Large-scale computers and supercomputers must operate at a very high speed in order to perform massive computations in a short time period. Bipolar circuits are used for the logic circuits. Bipolar memories, which can carry out read and write operations at a very high speed, are mainly used for the memory circuits.

A tremendously large number of bipolar memories are used in a computer. Therefore, to cope with demands for miniaturization of computers, it is required that bipolar memories be developed which are more highly integrated and smaller in size.

A bipolar memory is mainly composed of a memory cell having a flip-flop construction, an X-decoder, a Y-decoder, word line driver circuits, write/read circuits, and the like. In the prior art, the word line driving gate circuits for driving the word lines have usually been arranged at the ends of the word lines. This is because the patterns of prior art memory cells have been nearly equal in size to one of the transistors forming the word line driving gate circuits. Arrangement in a line of transistors forming the word line driving gate circuits within a block enables the width of the patterns of the driver circuits to be made approximately equal to that of the memory cells. This has been a very rational and appropriate pattern layout.

In such bipolar memories, however, the memory cells have been made increasingly denser and integrated due to the miniaturization of the transistors forming the same. On the other hand, the word line driving gate circuits have to use transistors having a large current capacity just as in the past. This is because:

(1) Cells in a bipolar memory are driven by current flowing from the word lines to the cells;
(2) It is desirable to drive cells with a large current to speed up the operation of the cells; and
(3) Even if cells are miniaturized and the driving current per cell decreased, the number of cells connected to a word line would be increased so as to attain the highest integration possible, resulting in the same driving current per word line. As a result, the pattern dimensions of the word line driving gate circuit cannot be reduced.

Accordingly, in the prior art pattern layout, the word line driving gate circuits obstruct attempts to achieve a higher density and greater integrated memory through miniaturization of memory cells. This results in wasted space between word lines. Moreover, it is desirable to make effective use of the space produced by wide power supply conductors.

SUMMARY OF THE INVENTION

It is the main object of the present invention to provide an improved pattern layout of word line driving gate circuits in a semiconductor memory device.

It is another object of the present invention to provide a technique for disposition of decoders in the space produced by wide power supply conductors for more effective design of a semiconductor memory device.

In accordance with the present invention, there is provided a semiconductor memory device including at least one pair of memory cell arrays having a plurality of word lines, a plurality of bit lines, and a plurality of memory cells disposed at the intersecting points of the word lines and the bit lines. A plurality of word line driving transistors are connected to the word lines and aligned at inner edges of the pair of memory cell arrays. At least a pair of word line driving gate circuits (the pitch of the word line driving gate circuits being matched to the pitch of the adjacent two word line pairs) are arranged along the direction of the word lines between the pair of memory cell arrays. The outputs of the word line driving gate circuits are connected to the word line driving transistors at both sides of the word line driving gate circuits. A plurality of decoder lines extend between the pair of word line driving gate circuits and are connected to the input terminals of the word line driving gate circuits.

BRIEF DESCRIPTION OF THE DRAWINGS

The invention will be further clarified by way of examples and with reference to the accompanying drawings, in which.

DESCRIPTION OF THE PREFERRED EMBODIMENTS

Figure 1:
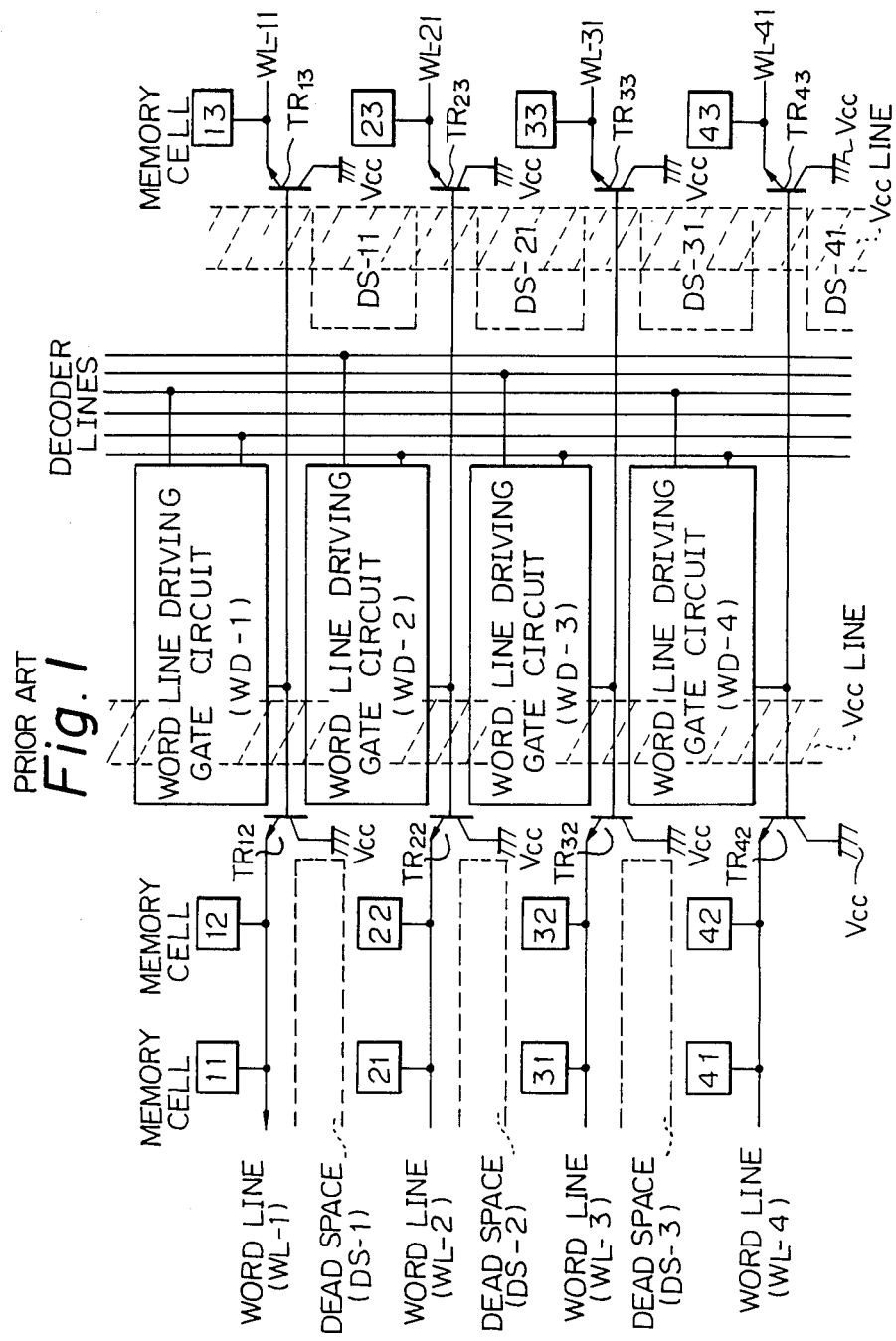
FIG. 1 is a plan view of a prior art semiconductor memory device with word line driving gate circuits.

Before discussing the preferred embodiments, the prior art pattern layout of word line driving gate circuits will be explained. In FIG. 1, a pattern layout includes word lines WL-1, WL-2, WL-3, ... connected to memory cells (11, 12), (21, 22), (31, 32), ... word line driving gate circuits WD-1, WD-2, WD-3, ... connected to the memory cells through transistors $TR_{12}$, $TR_{22}$, $TR_{32}$, and connected to memory cells 13, 23, 33, ... through transistors $TR_{13}$, $TR_{23}$, $TR_{33}$, .... Pairs of terminals of the word line driving gate circuits WD-1, WD-2, ... are connected to decoder lines. As can be seen, even if the memory cells are miniaturized, the word line driving gate circuits remain as they are, resulting in wasted dead spaces DS-1, DS-2, DS-4, DS-4, ... between word lines, that is, between WL-1 and WL-2, WL-2 and WL-3, WL-3 and WL-4, .... Further, on extensions of the word driving signal lines WL-11, WL-21, WL-31, WL-41, ..., there are dead spaces DS-11, DS-21, DS-31, DS-41, ....

According to the present invention, each two adjacent word lines are considered a pair. This ensures a dead space with a width of two memory cells connected to each adjacent word line, i.e., a width equivalent to the distance between two adjacent word lines. In that space, two word line driving gate circuit patterns, having the same current capacity as the prior art, for driving the respective word lines are disposed along the direction of the extensions of the word lines. Further, decoder lines intersect the word lines connected to the word line driving gate circuits at right angles and are arranged in the pattern layout regions of the word line driving gate circuits. This enables a high density of word lines in the region where the memory cells are arranged, (i.e., in the cell array region).

Figure 2:
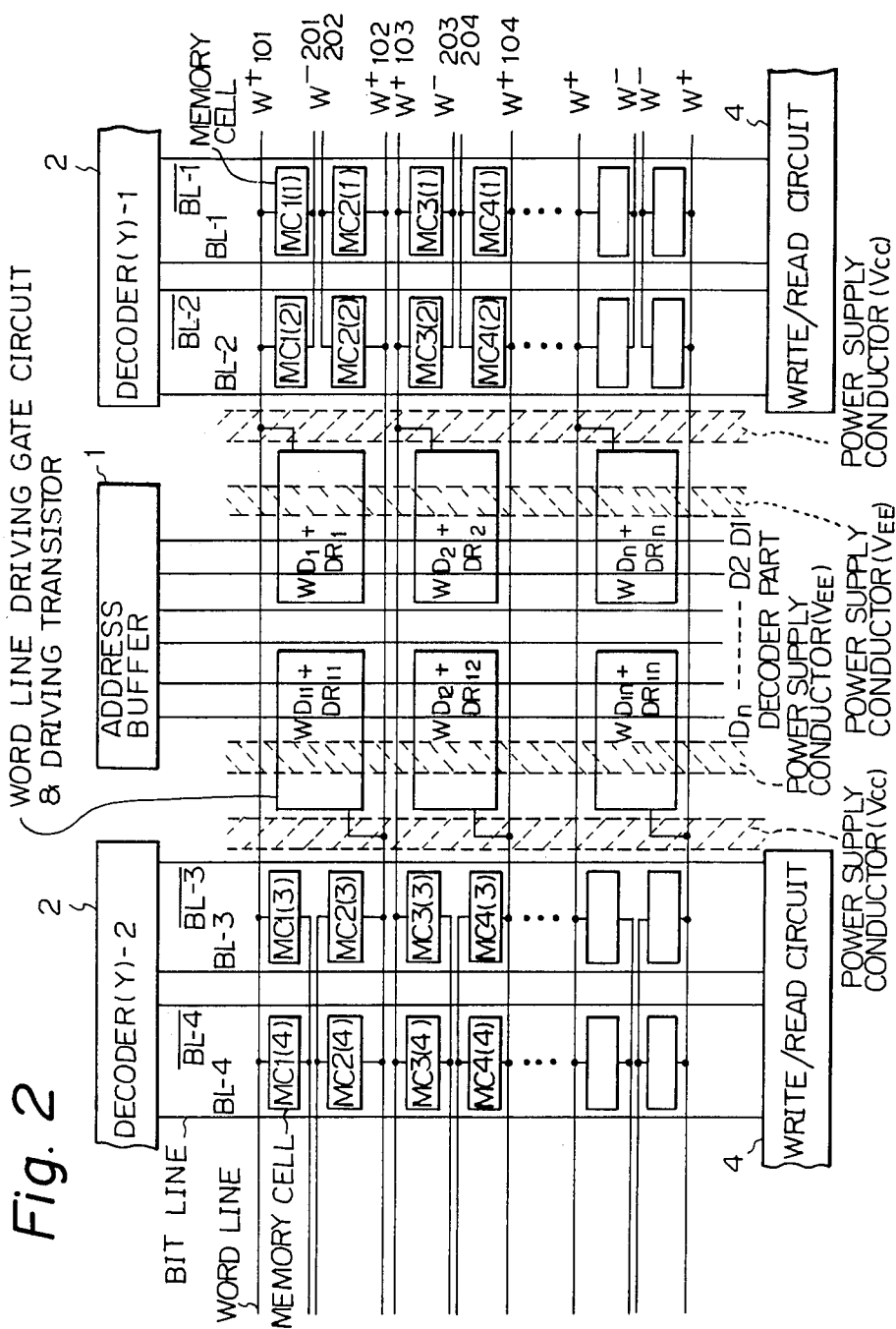
FIG. 2 is a plan view of a semiconductor memory device with word line driving gate circuits in accordance with an embodiment of the present invention.

FIG. 2 is a plan view of pattern layout of word line driving gate circuits in a bipolar memory according to an embodiment of the present invention. In this and later figures, equivalent elements bear identical reference numerals.

Figure 3:
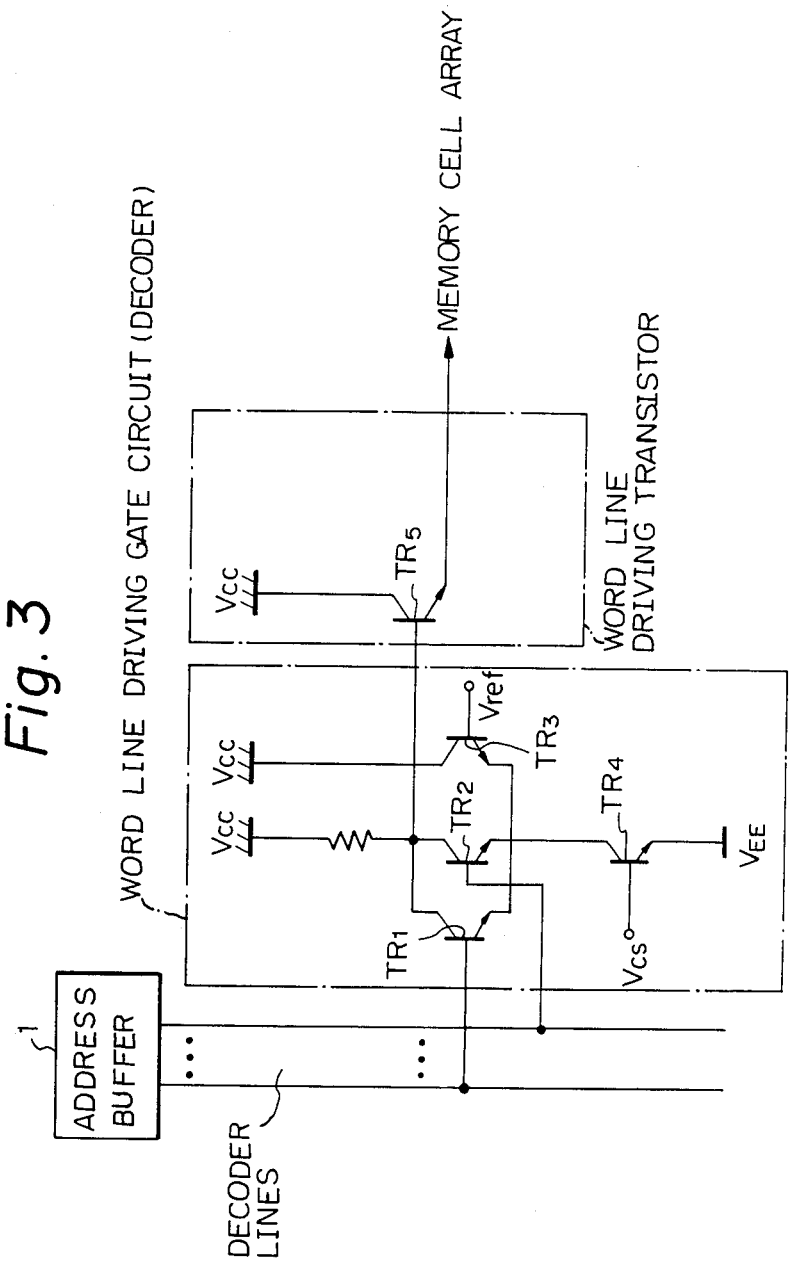
FIG. 3 is a circuit diagram of an example of a word line driving gate circuit in the device of FIG. 2.
Figure 4:
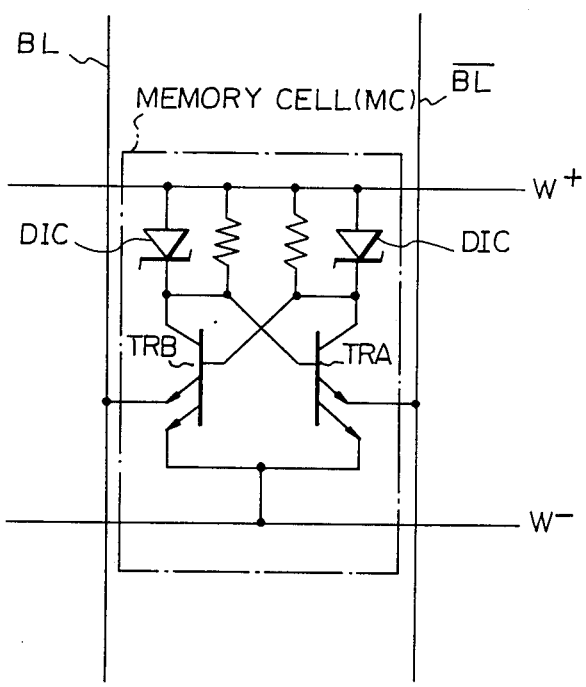
FIG. 4 is a circuit diagram of an example of a memory cell in the device of FIG. 2.

In FIG. 2, 1 is an X address buffer circuit, 2 is a Y-decoder circuit, and 4 is a write/read circuit. Dl to Dn denote decoder lines, and $WD_1$, $WD_{11}$, $WD_2$, $WD_{12}$, ... $WD_n$, $WD_{In}$ are pairs of word line driving gate circuits, each including several driving transistors. The circuit diagram of a word line driving gate circuit is shown in FIG. 3. An example of the circuit of a memory cell is shown in FIG. 4. In FIG. 4, MC denotes a memory cell. $W^+$ denotes a word line, $W^-$ a hold line, BL and $\overline{BL}$ bit lines. In FIG. 2, $V_{EE}$ denotes a power supply voltage line, e.g., −5.2 volts, and $V_{CC}$ denotes a power supply voltage line or ground line.

In FIG. 2, decoder lines Dl to Dn originate from an X-address buffer circuit 1. Some decoder lines pass through the location of pairs of word line driving gate circuits. The Y-decoder circuit 2 is connected to the write/read circuit 4 by pairs of bit lines BL and $\overline{BL}$, crossing word lines $W^+$ and hold lines $W^-$.

Pairs of word lines $W^+$ connect the word line driving gate circuits. That is, a first word line $W^+$ is connected to a word line driving gate circuit $WD_1+DR_1$ and a second word line $W^+$ is connected to a word line driving gate circuit $WD_{11}+DR_{11}$. Similarly, a third word line is connected to a word line driving gate circuit $WD_2+DR_2$, a fourth word line to a word line driving gate circuit $WD_{12}+DR_{12}$, and so on. Note that these word line driving gate circuits include the word line driving transistors which will be explained later.

A pair of power supply conductors $V_{CC}$ and $V_{EE}$ are provided on the integrated circuit containing the word lines $W^+$, word line driving gate circuits ($WD_1+DR_1$, $WD_{11}+DR_{11}$), ($WD_2+DR_2$, $WD_{12}+DR_{12}$), ... and ($WDn+DR_n$, $WDln+DR_{In}$), and memory cells MC. Some of the power supply conductors $V_{CC}$ and $V_{EE}$ are arranged in parallel with the decoder lines $D_l$ to $D_n$. The direction of the power supply conductors is perpendicular to the direction of the word lines $W^+$.

Moreover, a plurality of memory cells MC1(1), MC1(2), MC2(1), MC2(2), MC3(1), MC3(2), MC4(1), MC4(2), and so on, are connected to word lines $W^+$ and hold lines $W^-$. For instance, memory cells MC1(1) and MC1(2) are connected to a word line 101 at one terminal and connected with a hold line 201 at the other terminal, a pair of memory cells MC2(1) and MC2(2) are connected to a hold line 202 at one terminal and to a word line 102 at the other terminal, and so on.

Word lines 101, 102, 103, 104, ... and hold lines 201, 202, 203, 204, ... are arranged in parallel. Pairs of bit lines BL and $\overline{BL}$ are arranged perpendicular thereto.

As is apparent from the above-described embodiment, there is provided a semiconductor memory device wherein groups of two word lines are connected as pairs. Only the region of pattern layout for the word line driving gate circuits spreads over a distance corresponding to two pairs of word lines. Two word line driving gate circuits are disposed in the region of pattern lay out. Thus, the distance between word lines in the region of cell arrays can be kept small. That is to say, according to the structure of the present invention, two lines of memory cells are arranged along the side of one word line driving gate circuit.

Figure 5:
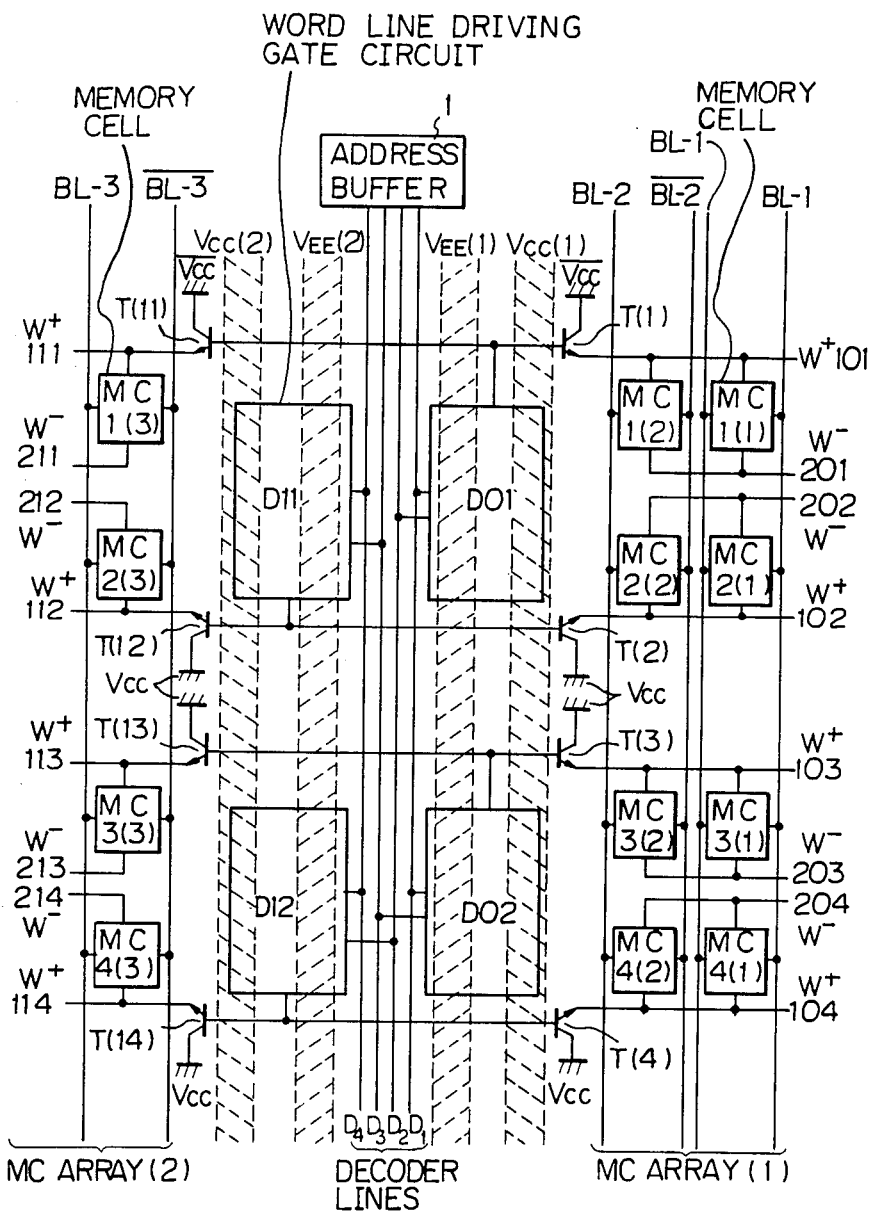
FIG. 5 is a plan view of the structure of the device of FIG. 2.

FIG. 5 is a plan view for explaining the structure of the device of FIG. 2. In FIG. 5 a pair of memory cell arrays MC ARRAY-1 and ARRAY-2 composed of plural memory cells, such as (MC1(1), MC1(2), MC2(1), and MC2(2), (MC1(3), MC1(4), MC2(3), and MC2(4)), (MC3(1), MC3(2), MC4(1), and MC4(2), and so on (MC1(4) and MC2(4) are not shown) are arranged along both sides of the decoder lines. In addition, word lines $W^+$ 101, 102, 103, and 104, hold lines $W^-$ 201, 202, 203, and 204, bit lines BL-1, $\overline{BL}/$, BL-2, $\overline{BL}/$, BL-3, $\overline{BL}/$, etc., are shown.

Pairs of word line driving transistors T(1), T(11); T(2), T(12); T(3), T(13); and T(4), T(14) are provided. The driving transistors T(1) and T(11), T(2) and T(12), T(3) and T(13), and T(4) and T(14) are respectively connected together and connected to the word line driving gate circuits D01, D11, .... Transistor T(1) is connected to the output of a word line driving gate circuit D01, word line 101, and memory cells MC1(1) and MC1(2). Just as transistor T(1) is connected to the word line 101, transistor T(2) is connected to a word line 102, T(3) to a word line 103, and T(4) to a word line 104. The plurality of transistors T(1), T(2), T(3), ... and T(11), T(12), T(13), ... are aligned at the inner edges of the memory cell arrays, respectively.

A pair of word line driving gate circuits D01 and D11 are arranged for a pair of memory cell arrays MEMORY CELL ARRAY-1 and MEMORY CELL ARRAY-2. A plurality of decoder lines D1, D2, D3 and D4 are connected to an address buffer 1 and coupled to the input of each word line driving gate circuit D01 and D11. The vertical length of the word line driving gate circuit corresponds to twice the distance between two adjacent word lines. The outputs of the word line driving gate circuits are connected to the word line driving transistors T(1), T(2), ... T(11), T(12), ... at both sides of the word line driving gate circuits. The voltage source line $V_{CC}$ may be arranged between the decoder lines and the memory cell arrays MC ARRAY-1 and MC ARRAY-2 utilizing the dead space between them and in parallel with the $V_{EE}$ line.

The reason why the layout shown in FIG. 5 can eliminate the dead spaces explained in prior art FIG. 1 is explained hereinafter.

In order to select the memory cells, the word line driving transistors, e.g., T(1), T(11), charge up the word line connected to the selected memory cell. Therefore, usually the word driving transistors T(1), T(11) ... are connected to a wider power supply line $V_{CC}$ which is arranged over or next to the word line driving transistors. Since pairs of memory cell arrays MC ARRAY-1 and MC ARRAY-2 are arranged in order to decrease the number of memory cells connected to the single word line, pairs of word line driving transistor arrays T(1), T(2), ... T(4) and T(11), T(12), ... T(14) should be arranged next to the edge of the memory cell arrays MC ARRAY-1 and MC ARRAY-2. This means that the wider power supply lines $V_{CC}(1)$ and $V_{CC}(2)$ are also arranged next to the edge of the memory cell arrays MC ARRAY-1 and MC ARRAY-2.

With respect to FIG. 1, taking into consideration the above issues in which a pair of memory cell arrays MC ARRAY-1 and MC ARRAY-2 are arranged at both sides of the decoder lines, pairs of vertical arrayed of word line driver transistors and pairs of wider power supply voltage conductor lines should be arranged at the sides of the pair of memory cell arrays, respectively. In FIG. 1, since the word line driving gate circuits WD-1, WD-2 . . . are arranged only one side of the decoder lines, the dead spaces DS-11, DS-21, DS-31, DS-41 and under the wider power supply conductor $V_{CC}$ LINE which is connected to the word line driver transistors TR13, TR23, TR33, TR43 (these connections are not shown in FIG. 1).

Furthermore, as already explained before, a problem occurs wherein the pitch of the word line driving gate circuits is not the same as the pitch of the word lines.

In consideration of the above-mentioned problems, the present embodiment in FIG. 5 eliminates the dead spaces and provides the best layout arrangement of circuits of the memory circuit.

That is, the word line driving gate circuits D01, D02 and D11, D12 are arranged in two vertical arrays along both sides of the decoder lines, and under each of the pair of wider power supply voltage line conductors $V_{CC}(1)$ and $V_{CC}(2)$.

The word line driving gate circuits are actually formed on the semiconductor substrate with a first lower conductive layer, and the power supply conductor lines $V_{CC}(1)$ and $V_{CC}(2)$ and $V_{EE}(1)$ and $V_{EE}(2)$ are actually formed by a second upper conductive layer which is formed over the first lower conductive layer. Also, each collector of the word driving transistors T(1), T(2) through T(4), and T(11), T(12) through T(14) are connected to the power suppply conductor lines $V_{CC}(1)$ and $V_{CC}(2)$, but such connections are not shown in FIG. 5. In addition, the wider lower supply lines $V_{EE}(1)$ and $V_{EE}(2)$ are connected to each of the word line driving gate circuits D01 to D12, but such connections are not shown in FIG. 5.

While the present invention has been explained above with reference to bipolar memories, it will be apparent that it can also be applied to MOS memories.

What is claimed is:

1. A semiconductor memory device comprising:
    a pair of memory cell arrays having a plurality of word lines, a plurality of bit lines, and a plurality of memory cells disposed at intersections of said word lines and said bit lines;
    a plurality of word line driving transistors respectively connected to said word lines and aligned at inner edges of said pair of memory cell arrays;
    a pair of word line driving gate circuits having input terminals and output terminals, the pitch of said word line driving gate circuits being matched to the pitch of adjacent word lines, arranged along the direction of said word lines between said pair of memory cell arrays, the output terminals of said word line driving gate circuits being respectively connected to said word line driving transistors; and
    a plurality of decoder lines extending between said pair of word line driving gate circuits and connected to said input terminals of said word line driving gate circuits, said pair of word line driving gate circuits decoding signals on said decoder lines independently input to said input terminals, said decoded signals driving said word line driving transistors.

2. A semiconductor memory device according to claim 1, further comprising a power supply conductor line arranged along said word line driving transistors and connected to said word line driving transistors.

3. A semiconductor memory device comprising:
    a pair of memory cell arrays, each memory cell array having an inner edge and including:
    word lines;
    bit lines intersecting said word lines; and
    memory cells, located at the intersection of said word lines and bit lines;
    word line driving transistors respectively connected to said word lines and adjacent to said inner edge of said memory cell arrays;
    word line driving gate circuits having input and output terminals and arranged in pairs between said pair of memory cell arrays, each said pair of word line driving gate circuits decoding signals independently input to said input terminals, for driving said word line driving transistors, said output terminals being connected to said word line driving transistors, said word line driving gate circuits having a pitch equal to the pitch of said word lines; and
    decoder lines extending between said pairs of word line driving gate circuits and connected to said input terminals of said word line driving gate circuits.

4. A semiconductor memory device according to claim 3, further comprising power supply conductor lines formed between said decoder lines and said word line driving transistors and parallel thereto, and operatively connected to said word line driving transistors.

5. A semiconductor memory device according to claim 1 wherein each of said word line driving gate circuits drives a pair of word line driving transistors and is arranged adjacent said inner edges of said memory cell arrays, and further comprising a power supply conductor line arranged at said inner edges of said memory cell arrays, respectively, in parallel with said word line driving transistors, and connected thereto.

* * * * *

UNITED STATES PATENT AND TRADEMARK OFFICE
CERTIFICATE OF CORRECTION

PATENT NO. : 4,695,978
DATED : SEPTEMBER 22, 1987
INVENTOR(S) : TOHRU ITAKURA

It is certified that error appears in the above-identified patent and that said Letters Patent is hereby corrected as shown below:

Col. 4, line 15, "ARRAY-2" should be --MC-ARRAY-2--;
line 22, change "$\overline{B1/}$" (first occurrence) to --$\overline{BL-1}$--;
line 22, change "$\overline{BL/}$" (second occurrence) to --$\overline{BL-2}$--;
line 22, change "$\overline{BL/}$" (third occurrence) to --$\overline{BL-3}$--.
Col. 5, line 8, delete "of" (third occurrence).

Signed and Sealed this

Twenty-sixth Day of January, 1988

Attest:

DONALD J. QUIGG

Attesting Officer — Commissioner of Patents and Trademarks